(12) United States Patent
De Foucauld

(10) Patent No.: US 8,884,705 B2
(45) Date of Patent: Nov. 11, 2014

(54) FREQUENCY SYNTHESIS DEVICE WITH FEEDBACK LOOP

(75) Inventor: Emeric De Foucauld, Seyssinet (FR)

(73) Assignee: Commissariat à l' énergie atomique et aux énergies alternatives, Paris (FR)

( * ) Notice: Subject to any disclaimer, the term of this patent is extended or adjusted under 35 U.S.C. 154(b) by 93 days.

(21) Appl. No.: 13/582,808

(22) PCT Filed: Mar. 3, 2011

(86) PCT No.: PCT/FR2011/050447
§ 371 (c)(1),
(2), (4) Date: Sep. 5, 2012

(87) PCT Pub. No.: WO2011/107715
PCT Pub. Date: Sep. 9, 2011

(65) Prior Publication Data
US 2012/0326758 A1 Dec. 27, 2012

(30) Foreign Application Priority Data
Mar. 5, 2010 (FR) ..................................... 10 51618

(51) Int. Cl.
*H03L 7/16* (2006.01)
*H03L 7/081* (2006.01)
*H03L 7/087* (2006.01)
*H03L 7/113* (2006.01)
*H03L 7/18* (2006.01)
*H03L 7/12* (2006.01)

(52) U.S. Cl.
CPC ................. *H03L 7/0812* (2013.01); *H03L 7/12* (2013.01); *H03L 7/087* (2013.01); *H03L 7/113* (2013.01); *H03L 7/16* (2013.01); *H03L 7/18* (2013.01)
USPC ................... 331/11; 331/10; 331/16; 331/34; 327/156; 327/159

(58) Field of Classification Search
CPC ......................................................... H03L 7/12
USPC .................. 331/10, 16, 34, 11; 327/156, 159; 455/260
See application file for complete search history.

(56) References Cited

U.S. PATENT DOCUMENTS

| | | | |
|---|---|---|---|
| 5,210,509 A * | 5/1993 | Greeff et al. ....................... 331/4 |
| 2004/0027181 A1 | 2/2004 | Watanabe | |
| 2006/0267692 A1* | 11/2006 | Tanaka ............................. 331/16 |
| 2008/0224789 A1 | 9/2008 | Chang et al. | |
| 2010/0052751 A1 | 3/2010 | Abe | |

OTHER PUBLICATIONS

International Search Report Issued Apr. 29, 2011 in PCT/FR11/050447 Filed Mar. 3, 2011.

* cited by examiner

*Primary Examiner* — Arnold Kinkead
(74) *Attorney, Agent, or Firm* — Oblon, Spivak, McClelland, Maier & Neustadt, L.L.P.

(57) ABSTRACT

A frequency synthesis device with a feedback loop includes: a phase-comparison control circuit; a frequency conversion unit voltage controlled by the control circuit; a feedback loop for supplying at least one signal issuing from the frequency conversion unit to the control circuit; at least one other control circuit for voltage control of the frequency conversion unit; and at least one other feedback loop for supplying at least one other signal issuing from the frequency conversion unit to the other control circuit.

10 Claims, 2 Drawing Sheets

FREQUENCY SYNTHESIS DEVICE WITH FEEDBACK LOOP

BACKGROUND

1. Field

The present invention concerns a frequency synthesis device with feedback loop.

2. Description of the Related Art

Such devices are known, for example controlled phase loops known as PLLs, generally referred to as phase locked loops, or delay locked loops (DLLs).

These devices can commonly be represented schematically by a device such as the one in FIG. 1, comprising a phase comparison control circuit 10, a frequency conversion unit 12 voltage controlled by the control circuit 10 and a feedback loop 14 for supplying a signal issuing from the frequency conversion unit 12 to the control circuit 10.

More precisely, in the case of PLLs and DLLs, the control circuit 10 comprises a phase comparator 16 with two outputs (generally called UP and DOWN), receiving as an input a reference signal at a frequency $F_{in}$ supplied by a reference frequency source 18 and the signal issuing from the frequency conversion unit 12 supplied by the feedback loop 14. It further comprises a charge pump 20 that injects or removes charges in or from a filtering or smoothing device 22 by means of two current sources controlled by the UP and DOWN outputs of the phase comparator 16. This enables the control circuit to supply a voltage at the output of the filtering or smoothing device 22 that is determined, for example proportionally, by the comparison of the signal supplied by the feedback loop with the reference signal.

For a PLL, the device 22 is more particularly a filter and the frequency conversion unit 12 comprises an internal oscillator controlled by voltage, the one supplied by the control circuit 10, for supplying an output signal at a frequency $F_{out}$ that is a multiple of the frequency $F_{in}$ and a divider for obtaining, from the output signal, a signal at the frequency $F_{in}$ to be supplied to the feedback loop 14. The voltage control makes it possible to finely regulate the frequency of the internal oscillator.

For a DLL, the device 22 is more particularly a smoothing capacitor unit and the frequency conversion unit 12 comprises a delay line controlled by voltage, the one supplied by the control circuit 10, for generating P out-of-phase signals at the frequency $F_{in}$ from the signal supplied by the reference frequency source 18 via a connection 24, and a frequency multiplier receiving these P out-of-phase signals for supplying an output signal at a frequency $F_{out}$ that is a multiple of the frequency $F_{in}$, more precisely at the frequency $F_{out}=P/2F_{in}$. The signal supplied to the phase comparator 16 by the feedback loop 14 is one of the P out-of-phase signals supplied by the voltage-control delay line, for example the first. The control voltage makes it possible to finely regulate the phase shifting of the P signals generated by the delay line.

The PLLs and DLLs are thus generally used in electronic circuits as high frequency sources. This is because these devices make it possible, from a low-frequency and high spectral purity source (for example quartz crystal emitting at a few MHz), to obtain high-frequency signals (for example a few GHz) with a spectral purity of better quality than the devices directly generating high-frequency signals.

In concrete terms, for a source with a low reference frequency and a high spectral purity $F_{in}$, a signal of good spectral purity at high frequency $F_{out}=NF_{in}$, N being a multiplying factor, is obtained at the output. This multiplying factor N is generally variable so as to vary the various channels of the standards used according to the application.

An important parameter of frequency synthesis devices is the time $\Delta t$ for establishing their operating regime, that is to say the time that they take to be functional, either at start-up, or when there is a change of channel (i.e. change in the factor N). This time $\Delta t$ endures during a transient regime, generally termed an engagement phase, preceding the operating regime.

An example of transient regime followed by a frequency synthesis device when there is a change of channel is illustrated in FIG. 2. When there is a change $\Delta F_{out}$ from a frequency $F_{out}$ to a frequency $F'_{out}$, the transient synthesised frequency regime follows an exponential envelope tending asymptotically towards $F'_{out}$ at a natural resonant frequency $\omega n$ during the period $\Delta t$.

The period $\Delta t$ of the engagement phase depends on the parameters constituting the frequency synthesis device and limits the reactivity thereof.

The patent application published under the number US 2002/0043995 describes a phase comparator, the internal structure of which reduces the duration of the engagement phase of the PLL or DLL device in which it is used. By virtue of this phase comparator, the frequency of the reference source is rapidly in phase with the output of the divider (in the case of the DLL) or the voltage-controlled delay line (in the case of the PLL). However, this reduction in the duration of the engagement phase is obtained at the cost of a greatly increased complexity of the phase comparator.

The patent application published under the number US 2007/0285132 describes a PLL comprising a selective charge pump connected to two phase comparators for accelerating the establishment of the operating regime. However, there also, this result is obtained at the cost of a complexity of the elements connecting the two phase comparators to the selective charge pump.

It may thus be desired to provide a frequency synthesis device with feedback loop that has a time for establishing its operating regime that is as short as possible while dispensing with at least some of the aforementioned problems and constraints.

BRIEF SUMMARY

The subject matter of the invention is therefore a frequency synthesis device with feedback loop, comprising a control circuit with phase comparison, a frequency conversion unit voltage controlled by the control circuit and a feedback loop for supplying at least one signal issuing from the frequency conversion unit to the control circuit, further comprising at least one other control circuit for the voltage control of the frequency conversion unit and at least one other feedback loop for supplying at least one other signal issuing from the frequency conversion unit to this other control circuit.

Thus, by making provision for exploiting in feedback at least one other signal issuing from the conversion unit in order to voltage control the latter by means of at least two phase-comparison control circuits, the control is more often achieved so that the time for establishing the operating regime of the frequency synthesis device is reduced accordingly. Since a conventional phase-comparison control circuit is generally very simple and with a surface area that is very much reduced compared with the general complexity and the total surface area of the frequency synthesis device in which it is used, providing several of them adds negligible additional complexity and surface area for a not insignificant gain.

Optionally, a frequency synthesis device according to the invention may comprise:

N control circuits for the voltage control of the frequency conversion unit and N feedback loops, the frequency conversion unit being designed to supply respectively N signals out of phase successively with each other by $2\pi/N$ to the N control circuits by means of the N feedback loops, at least one reference frequency source designed to supply respectively N reference signals out of phase successively with each other by $2\pi/N$ to the N control circuits.

Optionally also, a frequency synthesis device according to the invention may comprise:

two control circuits and two feedback loops, the frequency conversion unit being designed to supply respectively two signals in phase opposition to the two control circuits by means of the two feedback loops, at least one reference frequency source designed to supply respectively two reference signals in phase opposition to the two control circuits.

Optionally also, a frequency synthesis device according to the invention may comprise a quartz crystal frequency source and a divider dividing the signal supplied by the quartz crystal frequency source for the supply of the N reference signals to the N control circuits.

Optionally also, each control circuit comprises:

a phase comparator with two outputs receiving as an input one of the reference signals and the signal issuing from the frequency conversion unit supplied by the corresponding feedback loop, and a charge pump receiving as an input the outputs of the phase comparator and supplying as an output a control voltage for the frequency conversion unit.

Optionally also, when the device according to the invention is of the phase locked loop (PLL) type, the frequency conversion unit comprises a voltage-controlled oscillator placed at the output of the control circuits and a voltage divider connected between the voltage-controlled oscillator and the feedback loops.

In this case, the frequency synthesis device may further comprise a filter placed at the input of the voltage-controlled oscillator.

Optionally also, when the device according to the invention is of the delay locked loop (DLL) type, the frequency conversion unit comprises a voltage-controlled delay line placed at the output of the control circuits and supplying as an input out-of-phase signals at least some of which are supplied to the feedback loop and a frequency multiplier placed so as to receive the out-of-phase signals from the voltage-controlled delay line and to supply an output signal at demultiplied frequency.

In this case, the frequency synthesis device may further comprise a capacitor unit placed at the input of the voltage-controlled delay line.

Optionally also, a frequency synthesis device according to the invention may comprise means for disconnecting all the control circuits except one.

BRIEF DESCRIPTION OF THE DRAWINGS

The invention will be better understood by means of the following description, given solely by way of example, and made with reference to the accompanying drawings, in which.

DETAILED DESCRIPTION

Figure 1:
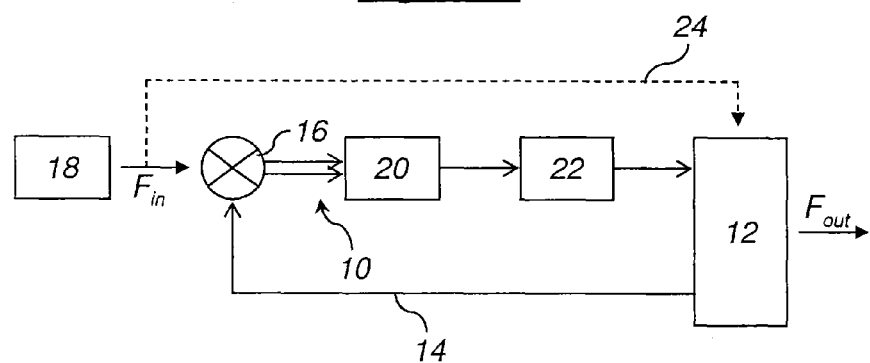
FIG. 1, already described, shows schematically the general structure of a frequency synthesis device with feedback loop of the prior art, FIG. 2, already described, is a time diagram illustrating an important parameter of the device of FIG. 1, namely the time for establishing its operating regime.
Figure 2:
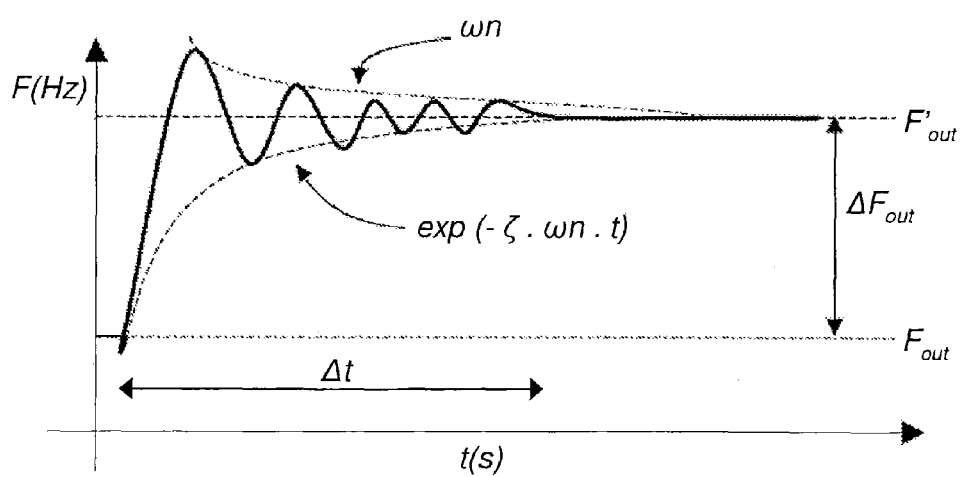
Figure 3:
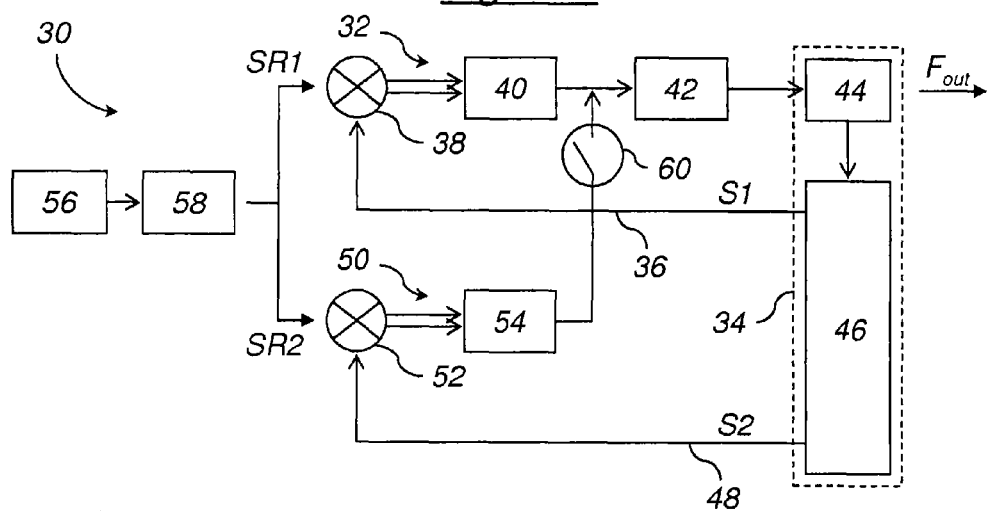
FIGS. 3 and 4 show schematically the general structures of frequency synthesis devices with feedback loop according to two embodiments of the invention.

FIG. 3 shows schematically a frequency synthesis device 30 of the PLL type, according to a first embodiment of the invention.

This device 30 comprises a first control circuit 32 with phase comparison, a frequency conversion unit 34 voltage controlled by the first control circuit 32 and a first feedback loop 36 for supplying a first signal S1 issuing from the frequency conversion unit 34 to the first control circuit 32.

More precisely, the first control circuit 32 comprises a first phase comparator 38 with two outputs UP and DOWN receiving as an input a first reference signal SR1 at a frequency $F_{in}$ and the first signal S1 supplied by the first feedback loop 36. It further comprises a first charge pump 40 that injects or removes charges in a filtering device 42 by means of two current sources controlled by the outputs UP and DOWN of the first phase comparator 38. This makes it possible to supply a voltage at the output of the filtering device 42 that is determined, for example proportionally, by comparing the signal S1 with the reference signal SR1 for controlling the frequency conversion unit 34.

More precisely also, the frequency conversion unit 34 comprises an internal oscillator 34 controlled by the voltage supplied by the filtering device 42 for supplying an output signal at a frequency $F_{out}$ that is a multiple of the frequency $F_{in}$. It further comprises a divider 46 for obtaining, from the output signal, two signals at the frequency $F_{in}$, one of these two signals being the signal S1 supplied by the first feedback loop 36, the other being a signal S2 in phase opposition with S1 supplied to a second feedback loop 48. Conventionally, the divider 46 in fact fulfils the functions of divider and phase shifter.

In the embodiment illustrated in FIG. 3, the frequency synthesis device 30 comprises a second control circuit 50 with phase comparison, for the voltage control of the internal oscillator 44 of the frequency conversion unit 34.

More precisely, the second control circuit 50 comprises a second phase comparator 52 with two outputs UP and DOWN receiving as an input a second reference signal SR2, at a frequency $F_{in}$ and in phase opposition with SR1, and the second signal S2 supplied by the second feedback loop 48. It further comprises a second charge pump 54 that injects or removes charges in the filtering device 42 by means of two current sources controlled by the outputs UP and DOWN of the second phase comparator 52. This makes it possible to supply a voltage at the output of the filtering device 42 that is determined, for example proportionally, by comparing the signal S2 with the reference signal SR2 for controlling the frequency conversion unit 34.

The reference signals SR1 and SR2 can be supplied by independent reference frequency sources, but in the embodiment envisaged they are supplied by a single reference source 56 combined with a divider 58 for supplying two signals SR1 and SR2 in phase opposition at the frequency $F_{in}$. In a variant, the reference source 56 could also directly supply the signal SR1 at the frequency $F_{in}$ to the first phase comparator 38 and the signal SR2 supplied to the second phase comparator 52 could be obtained by a simple sign inversion of SR1.

In practice, the reference source 56 is for example a quartz crystal, but it could also be an oscillator of the BAW (bulk acoustic wave) type or any other oscillator capable of emitting a signal with high spectral purity.

Finally, the device 30 comprises means 60 for disconnecting the second control circuit 50, for example a simple controlled switch or any other switch.

Thus, in transient start-up or channel-change phase, that is to say in engagement phase, the presence of the two control circuits 32 and 50 connected makes it possible to multiply by two the frequency of the controls (2. $F_{in}$ instead of $F_{in}$) and therefore to divide by two the time for establishing the operating regime. In operating regime, the switch 60 is opened in order to control the frequency conversion unit 34 only by means of the first control circuit 32 and thus to limit the energy consumption.

In concrete terms, it has been measured that, by means of simple conventional control circuits (a simple phase comparator and a charge pump), the time for establishing the operating regime of the frequency synthesis device can be brought down from approximately 500 μs is to approximately 250 μs. The over-consumption due to the presence of two control circuits is completely compensated for by the reduction of the time for establishing the operating regime. The disconnection of the second control circuit 50 in operating regime also makes it possible not to prolong this over-consumption when it is no longer useful.

The device 30 described previously comprises exactly two control circuits associated with two feedback loops, but it is very simple to extend the invention to a synthesis device comprising:

N control circuits for the voltage control of the frequency conversion unit 34 and N feedback loops, the divider/phase shifter 46 of the frequency conversion unit being designed to supply respectively N signals out of phase successively with each other by $2\pi/N$ to the N control circuits by means of the N feedback loops, at least one reference frequency source designed to supply respectively N reference signals out of phase successively with each other by $2\pi/N$ to the N control circuits.

N may be equal to 3, 4 or even more. The number of control circuits can be extended until the filtering device 42 can no longer, at each control operation, discharge the quantity of charge due to the previous control operation.

When N is a power of 2, it is in particular simple to obtain the N reference signals out of phase by $2\pi/N$ from the source 56 and the N signals issuing from the frequency conversion unit 34 also out of phase by $2\pi/N$ by means of the dividers 58 and 46, which combine the functions of division and phase shifting.

Advantageously, the frequency synthesis device with N control circuits thus obtained comprises means for disconnecting all the control circuits except one, in order to disconnect all the control circuits except one when the engagement phase has ended.

Figure 4:
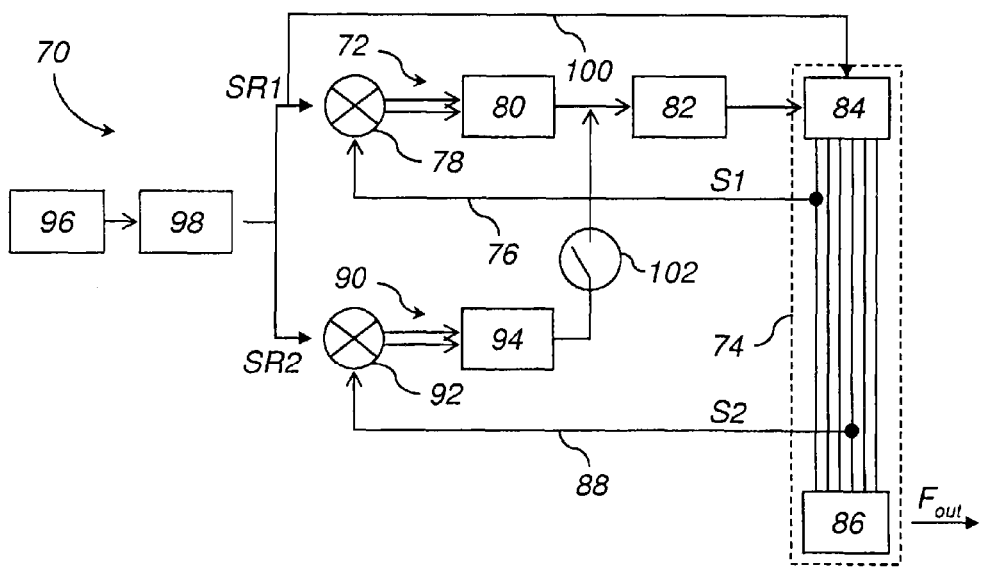

FIG. 4 shows schematically a frequency synthesis device 70 of the DLL type, according to a second embodiment of the invention.

This device 70 comprises a first control circuit 72 with phase comparison, a frequency conversion unit 74 voltage controlled by the first control circuit 72 and a first feedback loop 76 for supplying a first signal S1 issuing from the frequency conversion unit 74 to the first control circuit 72.

More precisely, the first control circuit 72 comprises a first phase comparator 78 with two outputs UP and DOWN receiving as an input a first reference signal SR1 at a frequency $F_{in}$ and the first signal S1 supplied by the first feedback loop 76.

It further comprises a first charge pump 80 that injects or removes charges in a smoothing capacitor unit 82 by means of two current sources controlled by the outputs UP and DOWN of the first phase comparator 78. This makes it possible to supply a voltage at the output of the smoothing capacitor unit 82 that is determined, for example proportionally, by comparing the signal S1 with the reference signal SR1 for controlling the frequency conversion unit 74.

More precisely also, the frequency conversion unit 74 comprises a delay line 84 controlled by the voltage supplied by the smoothing capacitor unit 82 for supplying P out-of-phase signals at the frequency $F_{in}$ from a reference signal at the frequency $F_{in}$, for example the reference signal SR1 supplied not only to the first phase comparator 78 but also to the delay line 84. It further comprises a frequency multiplier 86 arranged so as to receive the P out-of-phase signals from the voltage-controlled delay line 84 and to supply an output signal at a demultiplied frequency $F_{out}$. In concrete terms, $F_{out}=P/2F_{in}$. It will be noted that it is possible to obtain another multiplication factor, less than P/2, by selecting—for example by means of a multiplexer—the number of out-of-phase signals taken into account by the frequency multiplier 86. Two signals are chosen from the P out-of-phase signals at the output of the delay line 84. One of these two signals is the signal S1 supplied to the first feedback loop 76, the other being a signal S2 in phase opposition with S1 supplied to a second feedback loop 88. The first signal coming from the delay line is for example chosen for S1 and the $(P/2+1)^{th}$ for S2.

In the embodiment illustrated in FIG. 4, the frequency synthesis device 70 comprises a second phase-comparison control circuit 90, for voltage control of the delay line 84 of the frequency conversion unit 74.

More precisely, the second control circuit 90 comprises a second phase comparator 92 with two outputs UP and DOWN receiving as an input a second reference signal SR2, at a frequency $F_{in}$ and in phase opposition with SR1, and the second signal S2 supplied by the second feedback loop 88. It also comprises a second charge pump 94 that moves charges in or from the smoothing capacitor unit 82 by means of two current sources controlled by the outputs UP and DOWN of the second phase comparator 92. This makes it possible to supply a voltage at the output of the smoothing capacitor unit 82 that is determined, for example proportionally, by comparing the signal S2 with the reference signal SR2 for controlling the frequency conversion unit 74.

As in the previous embodiment, the reference signals SR1 and SR2 can be supplied by independent reference frequency sources, but they are here also supplied by a single reference source 96 combined with a divider 98 for supplying two signals SR1 and SR2 in phase opposition at the frequency $F_{in}$. In a variant, the reference source 96 could also directly supply the signal SRI at the frequency $F_{in}$ to the first phase comparator 78 and the signal SR2 supplied to the second phase comparator 92 could be obtained by a simple sign inversion of SRI.

In practice, the reference source 98 is for example a quartz crystal, but it could also be an oscillator of the BAW (bulk acoustic wave) type or any other oscillator capable of emitting a signal of high spectral purity.

A connection 100 is established between the reference source 96 (or more precisely the output of the divider 98 in the example illustrated) and the input of the delay line 84 for supplying the reference signal SR1 to the delay line 84.

Finally, the device 70 comprises means 102 for disconnecting the second control circuit 90, for example a simple controlled switch or any other switch, for the same reason as in the first embodiment described previously.

Once again, the device 70 described in the second embodiment comprises exactly two control circuits associated with two feedback loops, but it is very simple to extend the invention to a synthesis device comprising:

N control circuits for voltage control of the frequency conversion unit 74 and N feedback loops, from the time when N signals out of phase successively with each other by $2\pi/N$ can be chosen at the output of the delay line 84 so as to be supplied to the N control circuits by means of the N feedback loops, at least one reference frequency source designed to supply respectively N reference signals out of phase successively with each other by $2\pi/N$ to the N control circuits.

N may be equal to 3, 4 or even more. It is possible to extend the number of control circuits until the smoothing capacitor unit 82 can no longer, at each control operation, discharge the quantity of charge due to the previous control operation.

The N signals out of phase successively with each other by $2\pi/N$ chosen at the output of the delay line 84 are for example the $(k \cdot P/N+1)^{th}$ signals emerging from this delay line 84.

When N is a power of 2, it is in particular simple to obtain the N reference signals out of phase by $2\pi/N$ from the source 96 by means of the divider 98, which combines the division and phase shifting functions.

Advantageously, the frequency synthesis device with N control circuits thus obtained comprises means for disconnecting all the control circuits except one, in order to disconnect all the control circuits except one when the engagement phase has ended.

It is clear that a frequency synthesis device with feedback loop like one of those described previously has an engagement phase appreciably shorter than that of the known devices.

It can thus advantageously be used for the design of radiofrequency transceivers with frequency changes, for example multi-standard, reconfigurable and/or opportunistic radio systems, in particular in the field of the synthesis of digital frequencies.

It should be noted moreover that the invention is not limited to the embodiments described previously. It will be clear indeed to a person skilled in the art that various modifications can be made to the embodiments described above, in the light of the teaching that has just been disclosed to them. In the claims that follow, the terms used must not be interpreted as limiting the claims to the embodiments disclosed in the present description but must be interpreted so as to include therein all the equivalents that the claims aim to cover because of the wording thereof and which a person skilled in the art can foresee by applying their general knowledge to the implementation of the teaching that has just been disclosed to them.

The invention claimed is:

1. A frequency synthesis device with a feedback loop, comprising:
    a control circuit with a first phase comparator that performs phase comparison, a frequency conversion unit voltage controlled by the control circuit, and a feedback loop for supplying at least one signal issuing from the frequency conversion unit to the control circuit;
    at least one other control circuit, with a second phase comparator that performs phase comparison, for the voltage control of the frequency conversion unit and at least one other feedback loop for supplying at least one other signal issuing from the frequency conversion unit to the other control circuit; and
    means for disconnecting all the control circuits except one by controlling a connection between an output of the at least one other control circuit and an input to the frequency conversion unit.

2. A frequency synthesis device according to claim 1, comprising:
    N control circuits for voltage control of the frequency conversion unit and N feedback loops, the frequency conversion unit configured to supply respectively N signals out of phase successively with each other by $2\pi/N$ to the N control circuits by the N feedback loops;
    at least one reference frequency source configured to supply respectively N reference signals out of phase successively with each other by $2\pi/N$ to the N control circuits.

3. A frequency synthesis device according to claim 2, comprising:
    two control circuits and two feedback loops, the frequency conversion unit configured to supply respectively two signals in phase opposition to the two control circuits by the two feedback loops;
    at least one reference frequency source configured to supply respectively two reference signals in phase opposition to the two control circuits.

4. A frequency synthesis device according to claim 2, comprising a quartz crystal frequency source and a divider dividing the signal supplied by the quartz crystal frequency source for supplying the N reference signals to the N control circuits.

5. A frequency synthesis device according to claim 3, comprising a quartz crystal frequency source and a divider dividing the signal supplied by the quartz crystal frequency source for supplying the two reference signals to the two control circuits.

6. A frequency synthesis device according to claim 2, wherein
    the first phase comparator and the second phase comparator each includes two outputs receiving as an input one of the reference signals and the signal issuing from the frequency conversion unit supplied by the corresponding feedback loop; and
    each control circuit comprises a charge pump receiving as an input the outputs of the respective phase comparator and supplying as an output a control voltage for the frequency conversion unit.

7. A frequency synthesis device according to claim 1, of phase locked loop type, wherein the frequency conversion unit comprises a voltage-controlled oscillator placed at an output of the control circuits and a voltage divider connected between the voltage-controlled oscillator and the feedback loops.

8. A frequency synthesis device according to claim 7, further comprising a filter placed at an input of the voltage-controlled oscillator.

9. A frequency synthesis device according to claim 1, of delay locked loop type, wherein the frequency conversion unit comprises a voltage-controlled delay line placed at an output of the control circuits and supplying as an output out-of-phase signals at least some of which are supplied to the feedback loops, and a frequency multiplier arranged so as to receive the out-of-phase signals from the voltage-controlled delay line and to supply an output signal at demultiplied frequency.

10. A frequency synthesis device according to claim 9, further comprising a capacitor unit placed at an input of the voltage-controlled delay line.

* * * * *